United States Patent Office 3,475,171
Patented Oct. 28, 1969

3,475,171

SOLVENT DEVELOPMENT OF PHOTOPOLYMERIZED LAYERS

Francis Peter Alles, Basking Ridge, N.J., assignor to E. I. du Pont de Nemours and Company, Wilmington, Del., a corporation of Delaware

No Drawing. Continuation-in-part of application Ser. No. 560,889, June 27, 1966. This application Dec. 15, 1967, Ser. No. 690,730
Int. Cl. G03c *5/00, 1/68*
U.S. Cl. 96—35.1 6 Claims

ABSTRACT OF THE DISCLOSURE

A process for developing an exposed photopolymerizable layer containing a methyl methacrylate methacrylic acid, methyl methacrylate/itaconic acid, or styrene/itaconic acid copolymers by means of an aqueous composition comprising an alkaline agent and one or more solvents for the polymers. The process is useful for the development of photopolymerizable lithographic printing plates bearing such a layer.

This application is a continuation-in-part of my copending application Ser. No. 560,889 filed June 27, 1966 and entitled "Photosensitive Element and Process of Using Same" (now abandoned).

BACKGROUND OF THE INVENTION

Field of the invention

The invention pertains to aqueous developer compositions comprising an alkaline agent and one or more organic solvents, which are useful in developing the photopolymerizable printing plates disclosed in my above copending application.

Description of the prior art

The aqueous developer compositions of the present invention are useful in developing the photopolymerizable elements described in U.S. Ser. No. 560,889 as well as those described in assignee's copending application of Jeffers, U.S. Ser. No. 664,280, filed Aug. 30, 1967. The latter application represents an improved embodiment of the former, wherein the photopolymerizable stratum contains a yellow light-absorbing dye which results in reduction of light scattering to give improved exposure latitude and definition with no measurable decrease in photographic speed. Plambeck, U.S. 2,760,863, discloses that organic solvents can be used to develop exposed photopolymerizable strata by removing the unexposed areas thereof. Plambeck also suggests that aqueous solutions can be used in a similar manner and that these aqueous solutions should be alkaline if the photopolymerizable stratum is acidic or they should be acidic if the photopolymerizable stratum is alkaline. There is no suggestion, however, of using an aqueous alkaline developer composition containing organic solvents.

SUMMARY OF THE INVENTION

The invention comprises an aqueous developer composition comprising an alkaline agent in sufficient concentration to provide a pH between 8 and 13 and organic solvent(s) in an amount of 1–50 percent by volume. Preferably, the pH is between 9 and 12, and the solvent(s) concentration range is 2–25 percent by volume. The developer compositions are free from silver halide developing agents.

DESCRIPTION OF THE PREFERRED EMBODIMENTS

The invention is concerned with an aqueous developer composition which is useful in developing exposed photopolymerizable lithographic printing plates such as disclosed in assignee's copending application of Alles, U.S. Ser. No. 560,889 filed June 27, 1966. Two other applications of assignee described improved embodiments of photopolymerizable printing plates which may be advantageously developed in the compositions of the present invention, viz, Jeffers, U.S. Ser. No. 664,280, filed Aug. 30, 1967 and Chambers, U.S. Ser. No. 688,703, filed Dec. 7,1967. The composition comprises water as the major ingredient with one or more organic solvents, preferably from 2–25 percent by volume, and an alkaline agent in sufficient concentration to provide, in a preferred embodiment, a pH between 9 and 12. Buffering agents are present in particularly preferred compositions, and when a buffering agent is present the pH may be somewhat lower than is practicable in the absence of a buffering agent. Other useful but optional ingredients include wetting agents or surfactants which make it possible for the developer composition to have improved contact with the exposed plate to be developed. The developer may also contain dyes or pigments to intensify the image.

Particularly preferred organic solvents are the alkoxyethanols where alkoxy has 1–4 carbon atoms, e.g., 2-butoxyethanol. Alcohols are usable but in somewhat higher concentrations than the ether-alcohols. Useful solvents include diacetone alcohol, acetone, ethyl acetate, 2-methoxyethanol and 2-ethoxyethanol, ethyl alcohol, methyl alcohol, isopropyl alcohol, and butyl alcohol. The composition may comprise a single organic solvent or two or more organic solvents. The total concentration of organic solvents, however, should be between 1 and 50%, preferably between 2 and 25 percent by volume.

Any alkaline agent or agents may be used in the composition, the resulting pH being the important criteria, not the particular agent used to achieve the desired pH level. Suitable agents include alkali metal hydroxides, e.g., sodium, potassium hydroxide, ammonium hydroxide; carbonates, e.g., sodium and potassium carbonates; phosphates, e.g., trisodium phosphate, borate, such as borax, sodium metasilicate, organic amines such as ethanolamine, ethylenediamine, diethylenetriamine, 2-amino-2-hydroxymethyl-1,3-propanediol, 2-amino-2-methyl-1,3-propanediol, 1,3-diaminopropanol-2, morpholine and any other of the commonly used alkaline agents.

For various reasons, such as avoiding damage to the skin of personnel using the developer composition, it is desirable to maintain a pH as low as is consistent with satisfactory development of the plates. It has been found that lower levels of pH can be used when buffering agents are present. Also, the developer composition are more stable, i.e., they have a longer shelf life, when the pH is lower and buffers are included in the composition. Suitable buffers include trisodium phosphate, sodium acid phosphate, sodium carbonate, sodium bicarbonate, borates, e.g., borax.

Other optional ingredients in the developer composition include water softeners such as sodium hexametaphosphate, sodium pyrophosphate or the tetra sodium salt of ethylenediamine tetraacetic acid.

Various other ingredients may be included in the composition including compounds to produce a more pleasant odor.

In using the developer compositions of this invention an exposed photopolymerizable lithographic printing plate as described in one of the above applications is brought in contact with the developer composition in any convenient manner, e.g., by dipping, spraying, painting, flooding, etc. Development requires contact for between 5 and 120 seconds so that the unexposed or underexposed areas of the plate may be softened or loosened and removed by the developer. Simply soaking the plate in the developer may be sufficient although better results are usually obtained when the action of the developer composition is augmented by a mechanical treatment such as light brushing to aid in the removal of unexposed material. Multiple applications of the developer may be found to be expedient. At the end of the treatment time, the loosened, unpolymerized material is removed by washing with water after which the plates are gummed and then used in a printing press as described in the above applications.

The following examples illustrate the invention but are not intended to limit its scope.

EXAMPLE I

The following photopolymerizable solutions were prepared:

Solution A

| Component: | Weight, grams |
|---|---|
| Pentaerythritol triacrylate (U.S. Pat. 3,261,686, July 19, 1966) | 40.6 |
| Poly(methyl methacrylate/methacrylic acid) (90/10 mole ratio)[1] | 62.4 |
| Triethylene glycol diacetate | 12.8 |
| 2-tertiary butylanthraquinone | .94 |
| Phenanthrenequinone | .72 |
| Pontacyl® Wool Blue GL (C.I. Acid Blue 102) | 1.8 |
| 2-ethoxyethanol | 340.0 |

| Developer Solution | A | B | C | D | E | F | G | H | I | J | K | L | M | N | O | P | Q | R | S | T | U | V |
|---|---|---|---|---|---|---|---|---|---|---|---|---|---|---|---|---|---|---|---|---|---|---|
| $Na_3PO_4 \cdot 10H_2O$ | 25 | 25 | 25 | 25 | 25 | 25 | 0 | 0 | 0 | 0 | 2.5 | 2.5 | 2.5 | 25 | 25 | 25 | 5 | 0 | 0 | 25 | (*) | 25 |
| $Na_2CO$ | 0 | 0 | | 0 | 0 | 0 | 0 | 0 | 0 | 0 | 0 | 0 | 0 | 0 | 0 | 0 | 0 | 100 | 25 | 0 | 0 | 0 |
| $NaH_2PO_4 \cdot H_2O$ | (*) | (*) | 9 | 6 | (*) | 0 | 0 | 0 | 0 | 0 | 0 | 0 | 0 | 5 | 6 | 6 | (*) | 0 | 0 | (*) | 0 | (*) |
| NaOH | 0 | 0 | 0 | 0 | 0 | (*) | 0 | 0 | 0 | 0 | 0 | 0 | 0 | 0 | 0 | 0 | 0 | 0 | 0 | 0 | 0 | 0 |
| 2-butoxyethanol (ml.) | 60 | 60 | 60 | 45 | 45 | 45 | 60 | 60 | 60 | 60 | 60 | 60 | 60 | 45 | 45 | 45 | 90 | 60 | 45 | 45 | 45 | 60 |
| 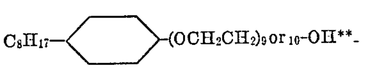 $(OCH_2CH_2)_{9\ or\ 10}$-OH** | 0.2 | 0.2 | 0.2 | 0.2 | 0.2 | 0.2 | 0.2 | 0.2 | 0.2 | .2 | .2 | .2 | .2 | .2 | .2 | .2 | .2 | .5 | .2 | .2 | .2 | .2 |
| Sodium hexametaphosphate | 1 | 1 | 1 | 12 | 12 | 12 | 0 | 0 | 0 | 0 | 0 | 0 | 0 | 0 | 0 | 0 | 0 | 1 | 2 | 12 | 12 | 0 |
| pH | 8 | 9 | 10 | 11 | 12 | 13 | 10 | 11 | 11 | 11 | 11.3 | | | 11 | 11 | 11 | 11 | 11.5 | 11 | 11 | 11 | 11 |
| Other additives | | | | | | | w | x | y | m | | n | p | q | r | | | | | s | t | |

*Added in sufficient concentration to give the preferred pH recorded in table.
**Added as a 10% by weight aqueous solution.
w=2-amino-2-hydroxymethyl-1,3-propanediol—8 g.
x=2-amino-2-methyl-1,3-propanediol—50 g.
y=1,3-diaminopropanol-2—50 g.
m=ethanolamine—50 g.
n=ethylenediamine—10 g.
[Also obtained satisfactory results with 50 g.]
p=diethylenetriamine—50 g.
q=sodium tetraphosphate—12 g.
r=ethylenediamine tetraacetic acid, tetrasodium salt—2 g.
s=polyethylene glycol, mol. wt. 400—100 g.
t=$K_2CrO_4$—25 g.

Solution B

| Component: | |
|---|---|
| Solution A | 100.0 |
| Yellow dye (3-hexadecyl, 4-hydroxymethyl, 4-methyl, 2-p-dimethylaminostyryl oxazoline nitrate) | 1.0 |
| 2-ethoxyethanol | 20.0 |

[1] Intrinsic viscosity=0.094 using methyl ethyl ketone as solvent.

Solution B was coated on a plate of nontreated, brush-grained aluminum, allowed to dry, and overcoated with a 3% aqueous soltuion of polyvinyl alcohol as described in Alles, Ser. No. 560,889, Example I, and in Example IV below.

The plate was exposed for 2 minutes through a halftone negative containing both 2% highlight dots and 98% shadow dots on a Nu Arc "Flip-Top" Plate Maker, Model FT26L, to the xenon light source.

The plate was developed by soaking in the following solution for 60 seconds, rubbing with a sponge and then rinsing with water.

Solution C

| Component | Amount |
|---|---|
| Water | ml.. 875 |
| Sodium hexametaphosphate | g.. 12 |
| Trisodium phosphate ($Na_3PO_4 \cdot 12H_2O$) | g.. 25 |
| Monobasic sodium acid phosphate ($NaH_2PO_4 \cdot H_2O$) | g.. 5 |
| 10 percent by weight aqueous solution of octylphenoxyethanol of the formula 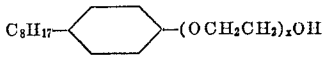 where $x$ is 9–10 | ml.. 2.0 |
| 2-butoxyethanol | ml.. 45 |
| Water to 1 liter. | |
| pH adjusted with $NaH_2PO_4 \cdot H_2O$ to 11.0. | |

The 2% highlight dots and the 98% shadow dots were visible on the developed plate. The plate was mounted on a Heidelberg KOR single color offset press. By using a conventional fountain solution and black offset ink 50,000 high quality impressions were made.

EXAMPLE II

Exposed plates, essentially the same as that described in Example I, were processed for 60 seconds in the developer solutions shown in the following table, after which they were rubbed with a developing pad and rinsed with water. In the table below, the ingredients added are in grams unless otherwise noted and sufficient water is added to make up one liter of solution. Although there were slight variations in the development action, all of the developer solutions in the table were used satisfactorily to produce high quality printing plates.

Developer Solution D was also used with only 15 seconds treatment time with results essentially equivalent to those obtained with the full 60 second treatment.

Essentially equivalent results were obtained when the surfactant

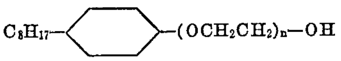

of Developer Solution P was replaced by 10% by weight aqueous solutions of the following surfactants (including materials which are positively charged, negatively charged, and electrically neutral).

Sodium dodecylsulfate
Sodium octadecylsulfonate
Polyoxyethylene (20) sorbitan monopalmitate
Stearyldimethylbenzyl ammonium chloride
Alkylpolyoxyethylene glycol
N-cetyl and C-cetyl betaines
Dioctyl sodium sulfosuccinate
Alkylaminocarboxylates and dicarboxylates
Polyoxyethylene/polyoxypropylene block polymer In place of the usual organic solvent 2-butoxyethanol, seven developer solutions were prepared according to the formula for Solution V but using the following organic solvents in the volumes indicated:

| | Ml. |
|---|---|
| Diacetone alcohol | 60 |
| Ethyl acetate | 40 |
| Ethyl alcohol | 120 |
| Acetone | 150 |
| 2-ethoxyethanol | 150 |
| Methyl alcohol | 120 |
| Isopropyl alcohol | 120 |

EXAMPLE III

Example II was essentially repeated, with very similar results, using the following developer solution.

| Developer Solution | A | B | C | D | E |
|---|---|---|---|---|---|
| Borax | 10 | 0 | 5 | 0 | 0 |
| $NH_4OH$ | | | 0.3 | | |
| $Na_3PO_4 \cdot 12H_2O$ | | | | 2.0 | 2.5 |
| NaOH | | 0.23 | | | |
| EtOH | | 250 | | | |
| 2-butoxyethanol | | | 10 | | |
| 2-methoxyethanol | | | | | 200 |
| Isopropanol | 160 | | 100 | | |
| Methylene chloride | | | | 20 | |
| 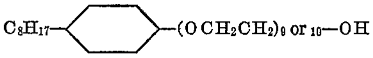 (added as a 10% by wt. aqueous solution) | 0.2 | 0.2 | 0.2 | 0.2 | 0.2 |
| Polyoxyethylene (20) sorbitan monopalmitate | | | | 2 | |
| pH | 9.5 | 12 | | 11.3 | 11.3 |

EXAMPLE IV

A grained aluminum printing plate, the surface of which has been treated with aqueous sodium silicate, was coated with a solution of methyl ethyl ketone (3:1) containing 20% solids of the following composition:

| | | |
|---|---|---|
| Polymethylmethacrylate/methacrylic acid (90/10 mole ratio)[1] | percent | 53.8 |
| Pentaerythritol triacrylate containing 0.4% of p-methoxyphenol as thermal inhibitor | do | 44.1 |
| 2-tertiary butylanthraquinone | do | 2.0 |
| Ethyl Violet (C.I. Basic Violet 4) dye | do | 0.1 |
| Approximate coating weight, solids | mg./dm.$^2$ | 87 |

[1] Intrinsic viscosity=0.094 using methyl ethyl ketone as solvent.

After drying, the plate was heated to 130° C. for 1 minute and cooled. The plate was overcoated with a 3% aqueous solution of polyvinyl alcohol (medium viscosity, 99% saponified) containing 2% of a polyoxyethylene surfactant of the formula

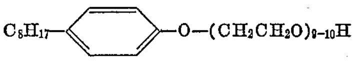

Coating weight of the photopolymerizable material was 86 mg./dm.$^2$. The polyvinyl alcohol coating weight was 12 mg./dm.$^2$.

The plate was exposed for 30 seconds through a negative (21-step Lithographic Technical Foundation on exposure wedge) in a vacuum frame, with a carbon arc[1] at a distance of 17 inches and operating at 45–50 amperes and 1200 watts, to yield a solid 7, i.e., the first 7 steps were polymerized sufficiently to resist removal by subsequent development.

The plate was developed by washing out the unexposed parts of the coating using a developer of the following composition:

| | Percent by vol. |
|---|---|
| Isopropyl alcohol (99%) | 10 |
| Sodium hydroxide | 0.1 |
| Water | 89.9 |

The plate was covered with the developer and allowed to soak for 30 seconds. The entire protective layer, along with the unexposed areas of the photopolymerizable layer, was removed by sponging. The developed plate was then rinsed with water and dried. The plate showed good ink/water characteristics, i.e., the exposed photopolymerized areas readily accepted lipophilic inks while the areas of the support from which unexposed photopolymerizable material had been removed accepted water readily. The plate ran satisfactorily on a wet offset press using a black printing ink and fountain solution.

[1] Nu Arc "Flip-Top" Plate Maker, Mod. FT26M–2.

As described in applicant's parent application Ser. No. 560,889 (abandoned), in place of the poly(methyl methacrylate/methacrylic) acid of Example I of this application and said parent application, one can substitute styrene/itaconic acid (90/10) or methyl methacrylate/itaconic acid (95/5) copolymers.

The copolymers just described are insufficiently soluble in aqueous alkali to be removed in exposed areas, but can be removed by the aqueous alkali/organic solvent solutions described in this application. As stated in the parent application, there should not be a sufficient number of carboxylic acid groups to make the copolymers soluble in dilute sodium hydroxide alone; but the copolymers should be soluble in a mixture of an organic solvent, water, and sufficient alkali to convert the majority of the carboxylic acid groups to salt groups.

Most of the developer compositions shown above have been homogeneous aqueous solutions. Similar results could be obtained with heterogeneous compositions, i.e., dispersions or emulsions, wherein the aqueous phase is distinct from the organic solvent phase. It is preferred, however, that the organic solvent(s) be miscible with water.

The developer compositions of this invention, especially preferred compositions such as shown in Example I, have the advantages of simplicity of use, stability, ability to yield reproducible results. The preferred compositions, which are clear solutions, permit visual observation of the progress of development of the plates and thus provide some measure of control by visual inspection.

These developer compositions can be used for machine processing as well as for manual processing. Particularly preferred compositions, especially designed for machine processing, might use lower concentrations of surfactant (to prevent foaming) than the compositions prefered for hand processing. The composition must be formulated so that it is active enough for rapid development but yet not so active that the polymerized areas of the plate are weakened. Thus, for machine processing, it might be desirable to go to higher pH values since there is no problem of irritating the skin of the operator as in hand processing. Even with machine processing, though, the pH must not be so high as to cause over development or weakening of the exposed areas of the plate.

Developer compositions which have a very high proportion of water, e.g., the composition of Example I, can obviously be prepared in a more concentrated form for ease and economy of shipping and storage. The composition can then be diluted with water to bring it to the desired concentration just prior to use. The minimum water content of concentrated solutions is limited only by the solubility of the ingredients.

The embodiments of the invention in which an exclusive property or privilege is claimed are defined as follows:

1. A process for developing an exposed photopolymerizable layer which comprises treating said layer with an aqueous developer solution comprising water, a water-soluble alkaline agent, and at least one organic solvent in an amount of 1–50% by volume, said solution having a pH from 8 to 13 to remove the unexposed and unpolymerized areas of said layer, the layer containing.

(a) at least one non-gaseous ethylenically unsaturated compound containing at least two terminal ethylenic groups having a boiling point greater than 100° C. at normal atmospheric pressure and being capable of forming a polymer by photo-initiated addition polymerization, (b) an addition polymerization initiator activatable by actinic radiation, and (c) a methyl methacrylate/methacrylic acid, methyl methacrylate/itaconic acid, or a styrene/itaconic acid copolymer binder, said copolymer being insufficiently soluble in dilute aqueous alkali to be removable therewith, but containing a sufficient number of carboxylic acid groups to be removable in the aforesaid aqueous developer containing the alkaline agent and the organic solvent.

2. A process according to claim 1, wherein said layer is on a support and said copolymer is a methyl methacrylate/methacrylic acid (90/10) copolymer.

3. A process according to claim 1, wherein said solvent is an alkoxyethanol wherein the alkoxyethanol radical contains 1–4 carbon atoms.

4. A process according to claim 1, wherein said alkaline agent is sodium acid phosphate and said solvent is 2-butyoxyethanol.

5. A process according to claim 1, wherein said solution comprises water, a water-soluble alkaline agent, and at least one water-miscible or water-soluble organic solvent in an amount of 2–25% by volume, said solution having a pH from 9–12.

6. A process according to claim 1, wherein said alkaline agent is sodium hydroxide and said solvent is isopropanol.

References Cited

UNITED STATES PATENTS

| | | | |
|---|---|---|---|
| 2,902,365 | 9/1959 | Martin | 96—115 XR |
| 2,927,022 | 3/1960 | Martin et al. | 96—115 XR |
| 2,990,281 | 6/1961 | Printy et al. | 96—115 XR |
| 3,252,800 | 5/1966 | Smith | 96—115 |
| 3,255,004 | 6/1966 | Thommes | 96—35.1 |

FOREIGN PATENTS

| | | |
|---|---|---|
| 731,086 | 3/1966 | Canada. |

NORMAN G. TORCHIN, Primary Examiner

RONALD H. SMITH, Assistant Examiner

U.S. Cl. X.R.

96—115